United States Patent [19]

Lin et al.

[11] Patent Number: 5,682,348
[45] Date of Patent: Oct. 28, 1997

[54] PROGRAMMING SWITCH FOR NON-VOLATILE MEMORY

[75] Inventors: Yi-Pin Lin; Teng Tsai Lin, both of Hsin-Chu, Taiwan

[73] Assignee: Myson Technology, Inc., Taiwan

[21] Appl. No.: 628,095

[22] Filed: Apr. 9, 1996

[51] Int. Cl.⁶ .................................................. G11C 16/06
[52] U.S. Cl. .................... 365/185.23; 365/189.09; 365/189.11; 365/230.06; 365/226
[58] Field of Search .................... 365/185.23, 189.09, 365/226, 189.11, 230.06

[56] References Cited

U.S. PATENT DOCUMENTS 4,831,589  5/1989  Brahmbhatt .................... 365/189.09
5,101,381  3/1992  Kouzi .............................. 365/185.23
5,265,052  11/1993  D'Arrigo et al. ................ 365/185.23

*Primary Examiner*—David C. Nelms
*Assistant Examiner*—Andrew Q. Tran
*Attorney, Agent, or Firm*—Cushman Darby & Cushman IP Group of Pillsbury Madison & Sutro LLP

[57] ABSTRACT

The object of present invention is to provide a programming switch for non-volatile memory wherein output voltage Vout versus input voltage Vin satisfies the following relations: (1) While Vin is logic "0", Vout is logic "0"; (2) While Vin is logic "1", Vout is about the value of programming voltage Vpp if programming is executed and about the value of supply voltage Vcc if programming is not executed. The present invention is characterized in that it can be utilized in general non-volatile memory and the supply voltage needed can be as low as 2 volts, resulting in body effect almost giving no influence.

16 Claims, 11 Drawing Sheets

PROGRAMMING SWITCH FOR NON-VOLATILE MEMORY

BACKGROUND OF THE INVENTION

1. Field of the Invention

The present invention relates in general to a programming switch for non-volatile memory, in particular, the present invention relates to a programming switch which requires an operating voltage of only approximately 2 volts.

2. Technical Background

Conventional programming switches are generally designed for EEPROM, which require a programming voltage Vpp with typical value 15 to 20 volts generated inside the circuits by themselves and a supply voltage Vcc with typical value 5 volts. The aforementioned circuits can be simplified if ordinary 1.5-volts battery can be used as the supply voltage Vcc. Usually two 1.5-volts batteries in series connection are used as supply voltages in ordinary electronic systems, which can provide a supply voltage as low as about 2.2 volts. In view of this, a programming switch for EEPROM has been disclosed in U.S. Pat. No. 4,831,589, which provides a circuit design using batteries as its supply voltage.

The aforementioned conventional technology can only be utilized in EEPROM, besides the minimum operating voltage, provided by supply voltage, is very near to the lowest voltage 2.2 volts what two batteries in series connection can provide. Therefore, requirements for body effect of the NMOS that can be used are very strict, only very small body effect is allowed.

SUMMARY OF THE INVENTION

In view of the above drawbacks, the primary object of the present invention is to provide a programming switch which can be used in general non-volatile memory and requires a supply voltage which is below 2 volts. The present invention thus provides more feasibility in using batteries as supply voltage than that can be provided by conventional technology. Furthermore, the influence coming from body effect is very small because of the considerably low supply voltage.

Figure 1A:
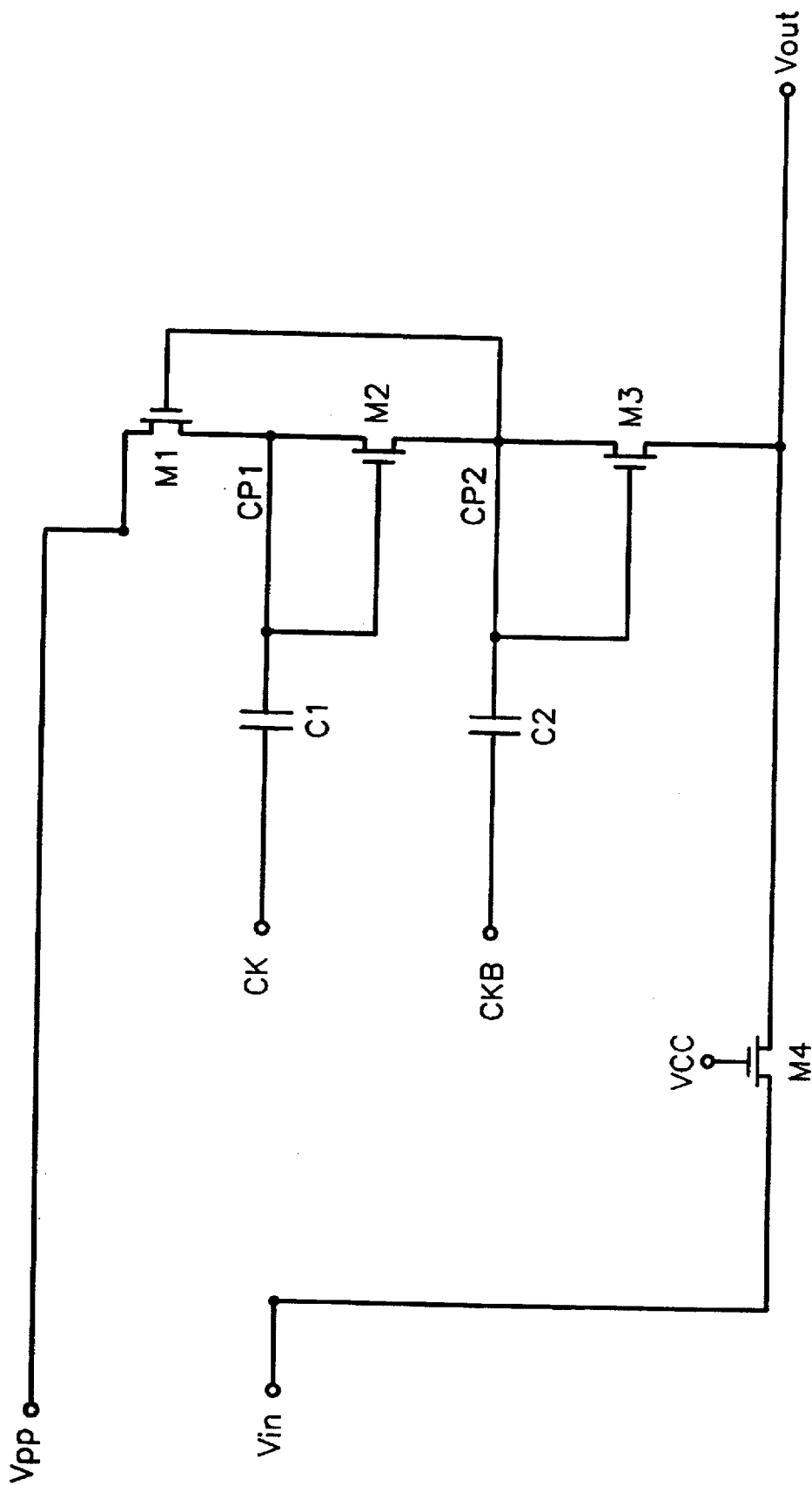
Referring to FIG. 1A, the programming switch in accordance with the present invention comprises: a programming voltage Vpp generated inside the circuit by itself with typical value 15 to 20 volts, a supply voltage Vcc provided by external power supply, an input end whose voltage Vin has two different values: logic "1" and logic "0", an output end with voltage Vout, two clock signals CK and CKB which are inverse to each other and actuated only when Vin is logic "1", nodes CP1 and CP2, an enhancement-type NMOS M1 whose gate is connected to node CP2 and whose drain and source are connected between programming voltage Vpp and node CP1, a diode-connected enhancement-type NMOS M2 whose gate is connected to node CP1 and whose drain and source are connected between nodes CP1 and CP2, a diode-connected enhancement-type NMOS M3 whose gate is connected to node CP2 and whose drain and source are connected between node CP2 and output end, an enhancement-type NMOS M4 whose gate is connected to supply voltage Vcc and whose drain and source are connected between input end and output end, a capacitor C1 in which one end thereof is connected to clock CK and another end thereof is connected to node CP1, a capacitor C2 in which one end thereof is connected to clock CKB and another end thereof is connected to node CP2.
Figure 1B:
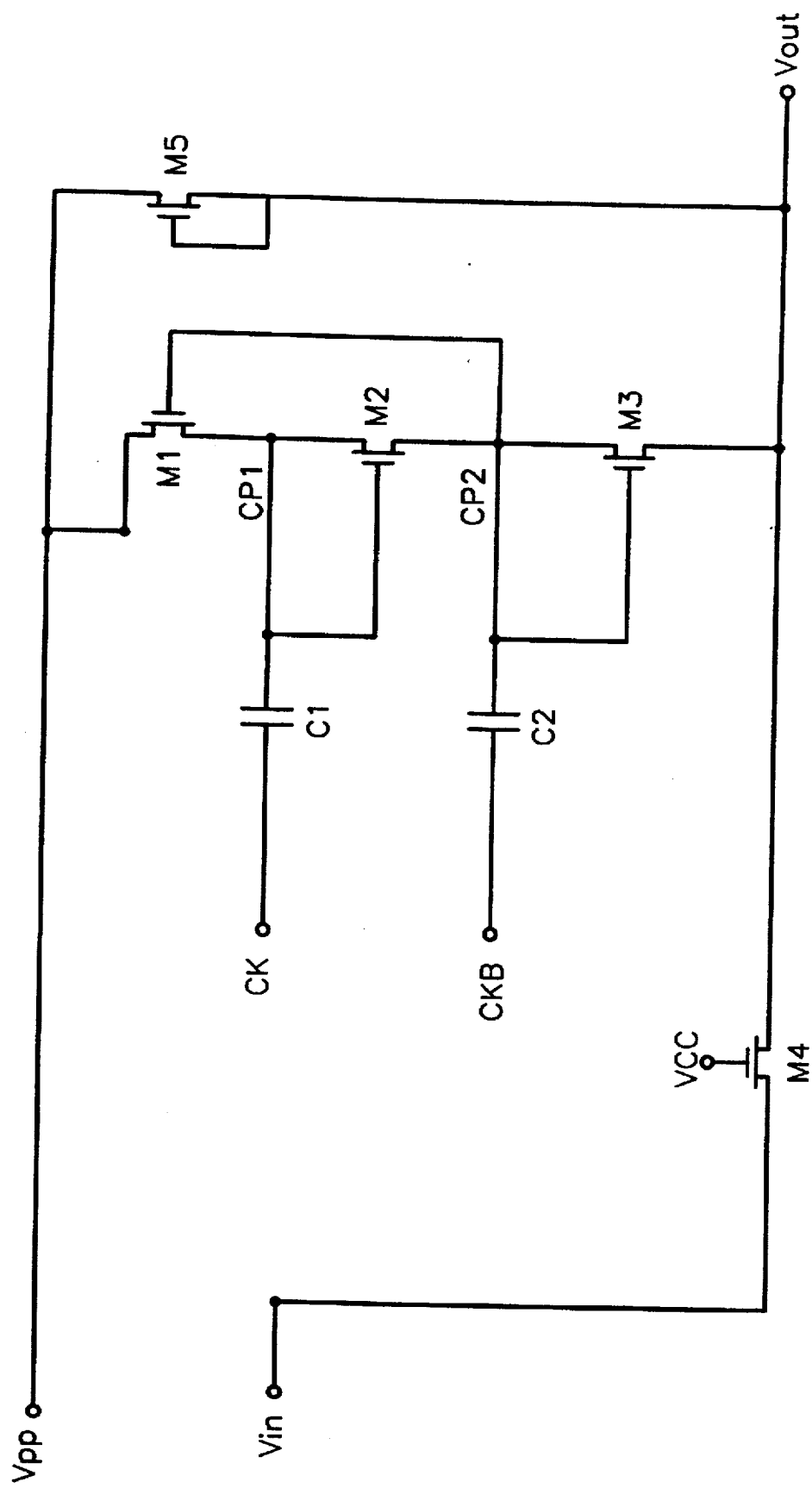
Figure 1C:
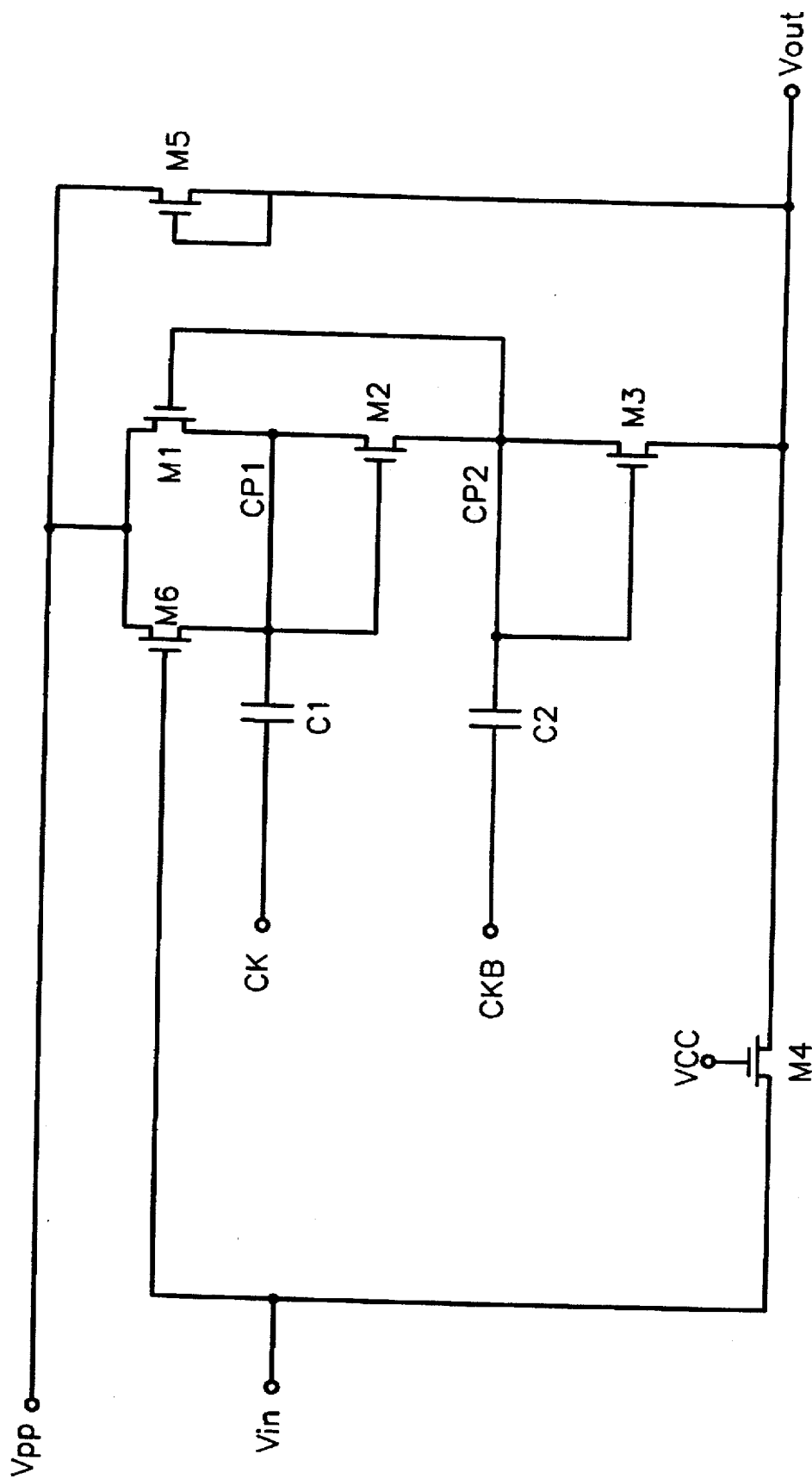
Figure 1D:
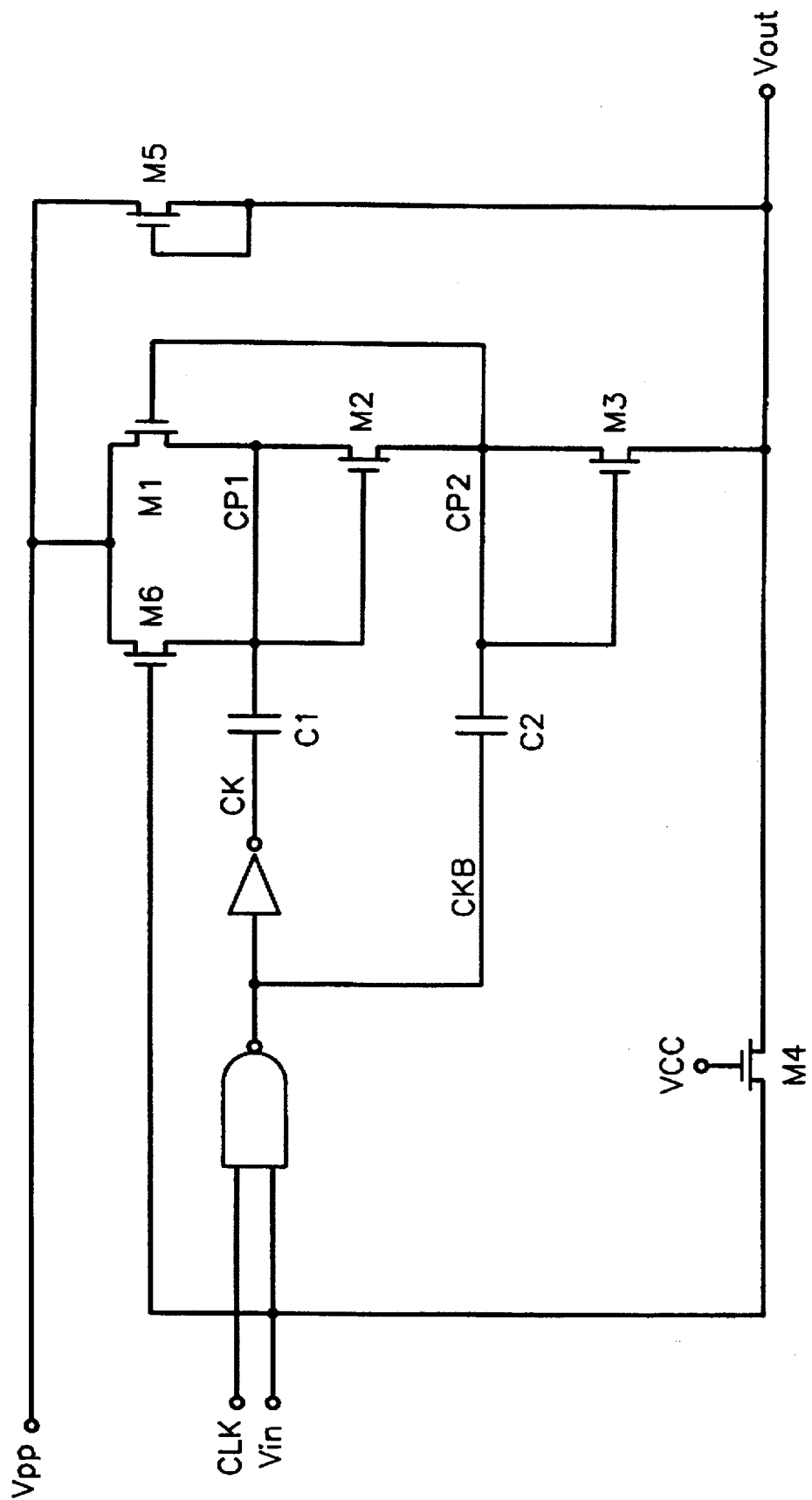
Figure 2:
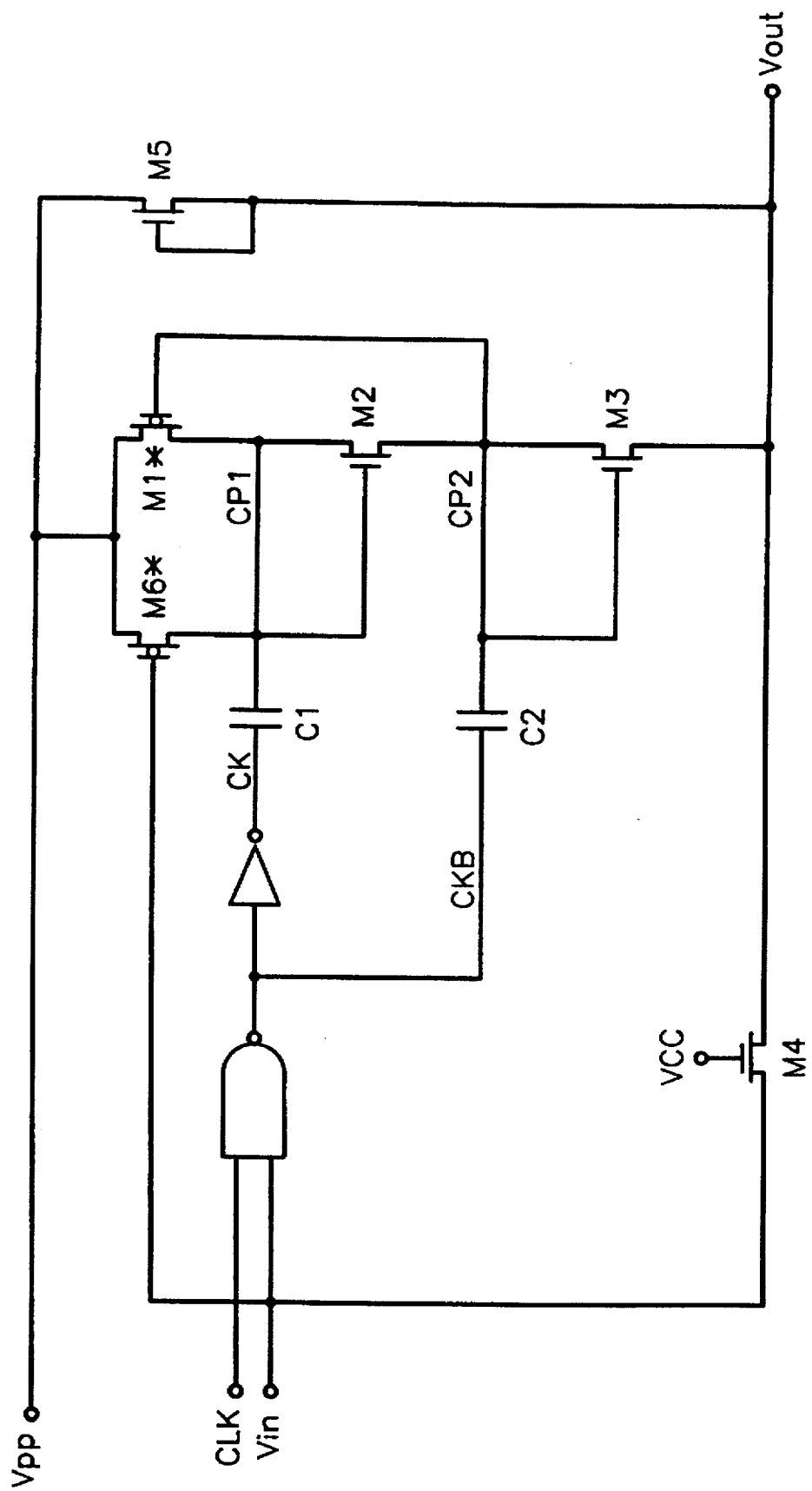
Figure 3:
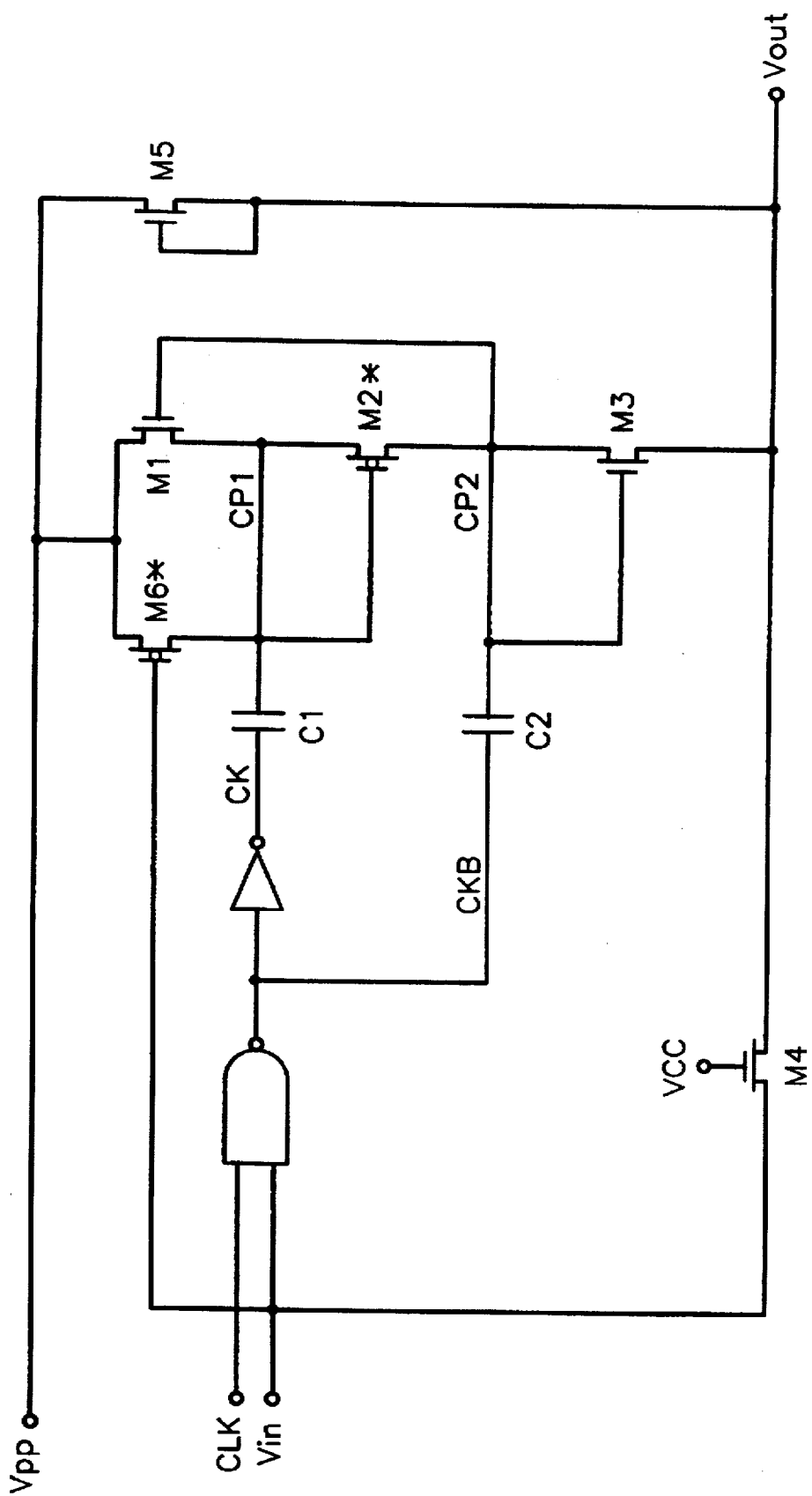
Figure 4:
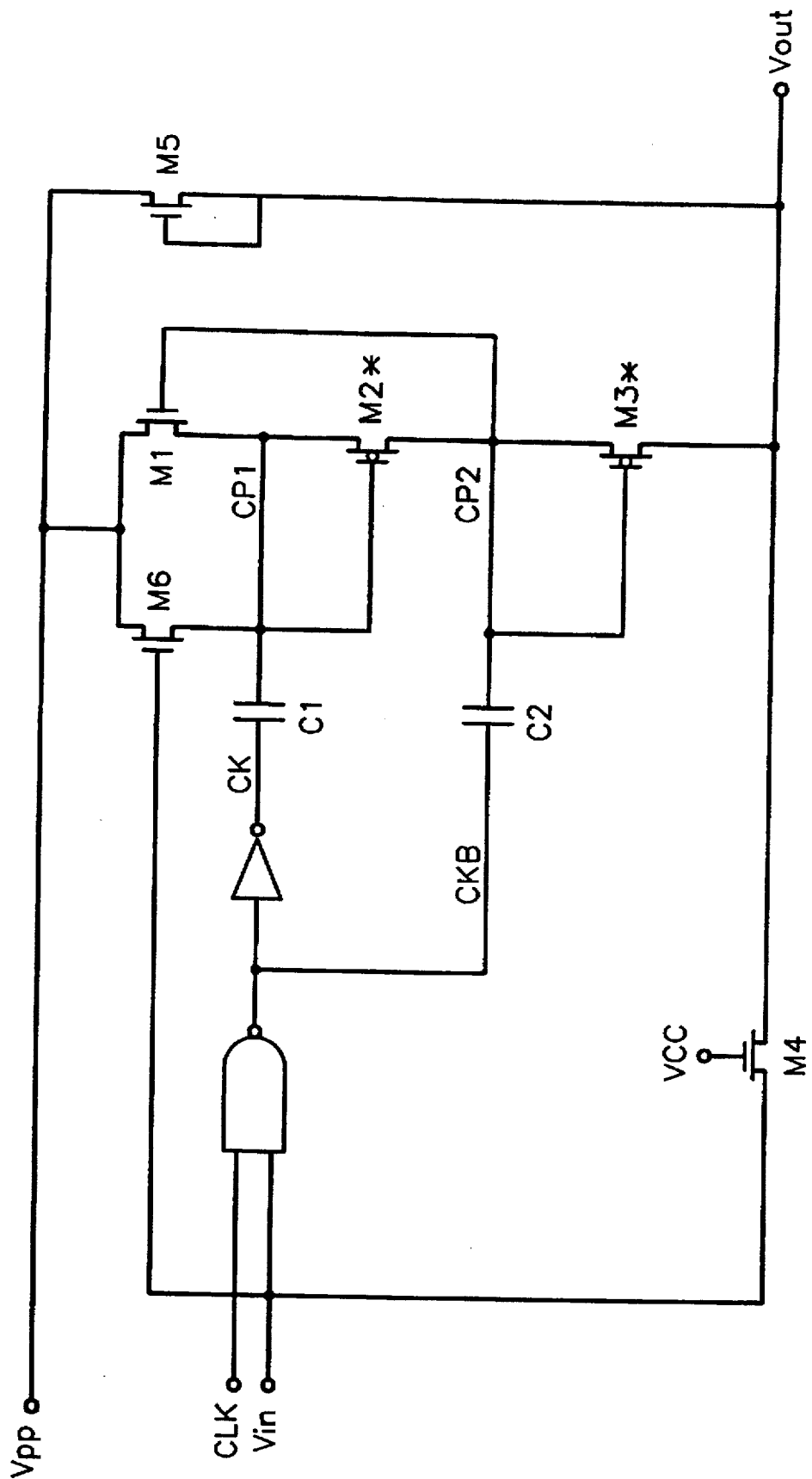
Figure 5A:
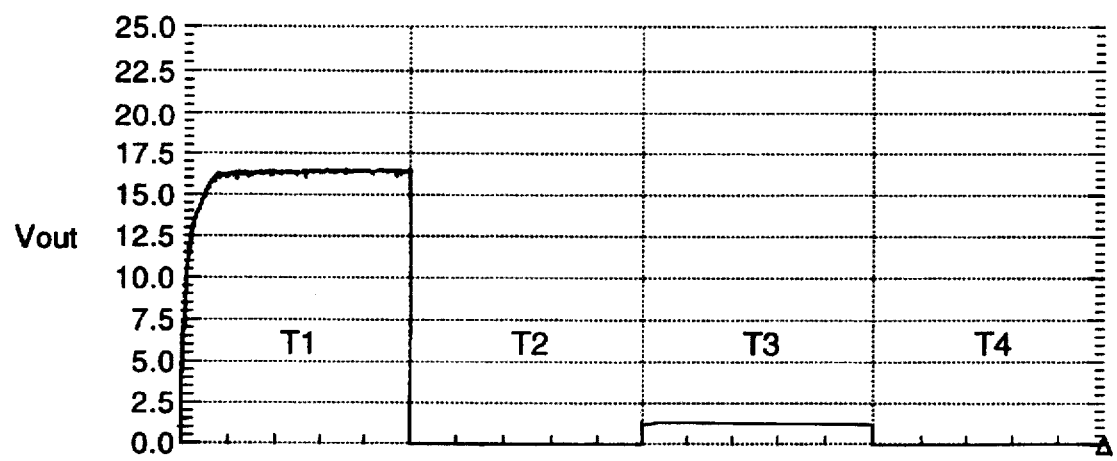
Figure 5B:
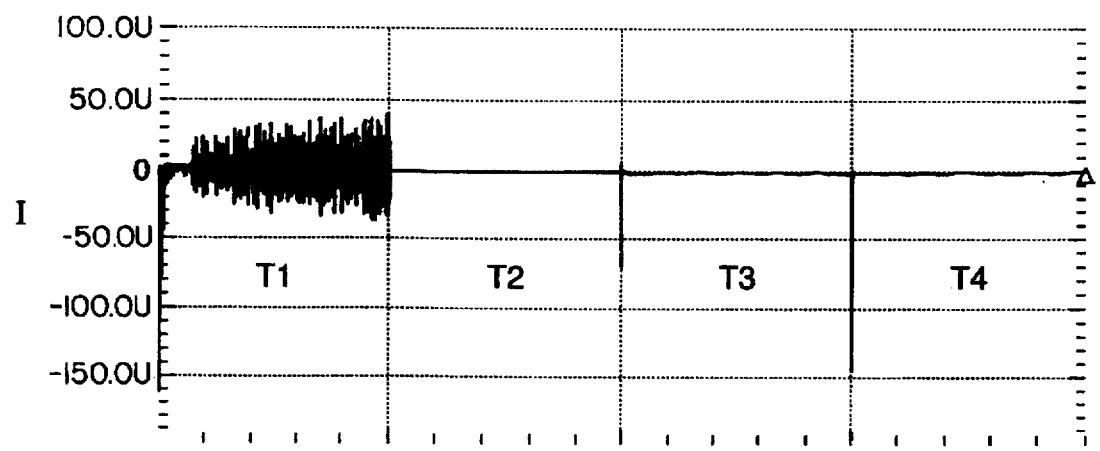
Figure 6A:
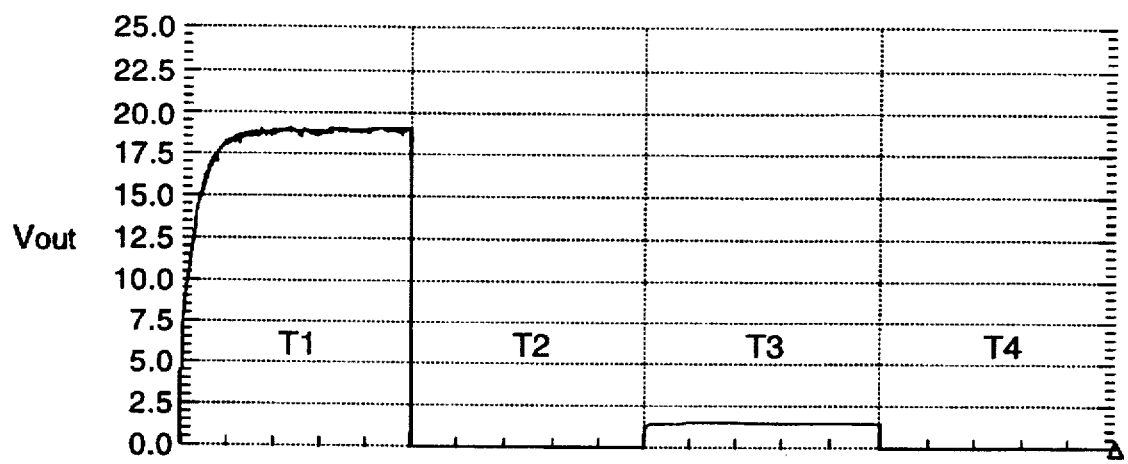
Figure 6B:
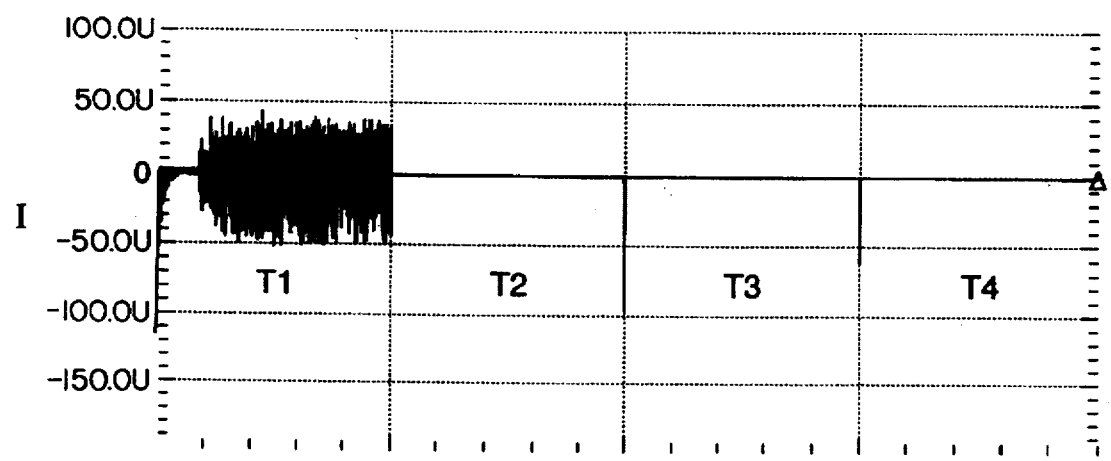
Figure 7A:
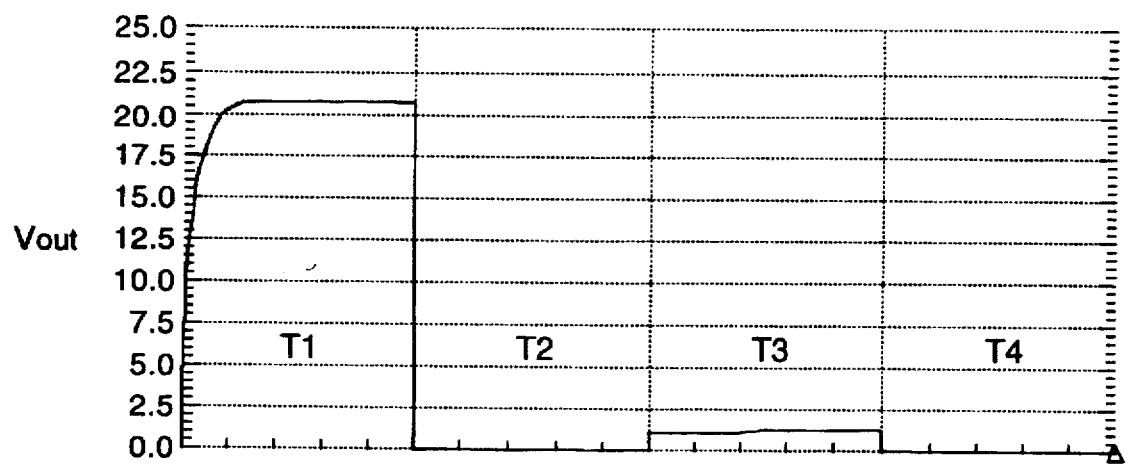
Figure 7B:
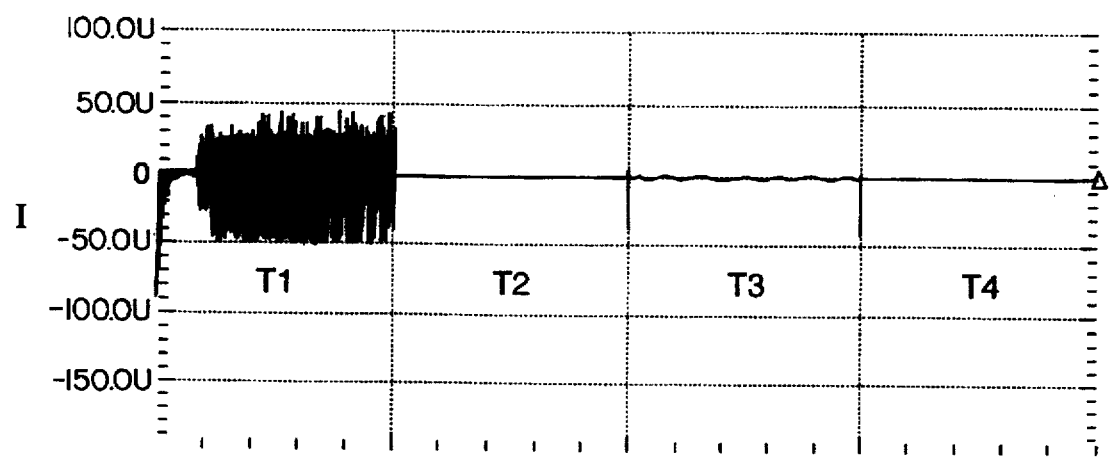
Figure 8A:
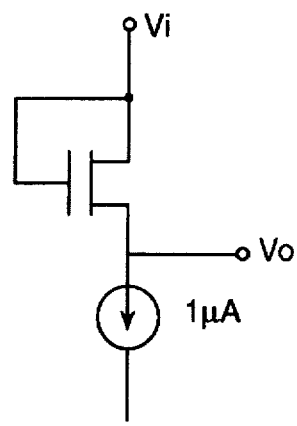
Figure 8B:
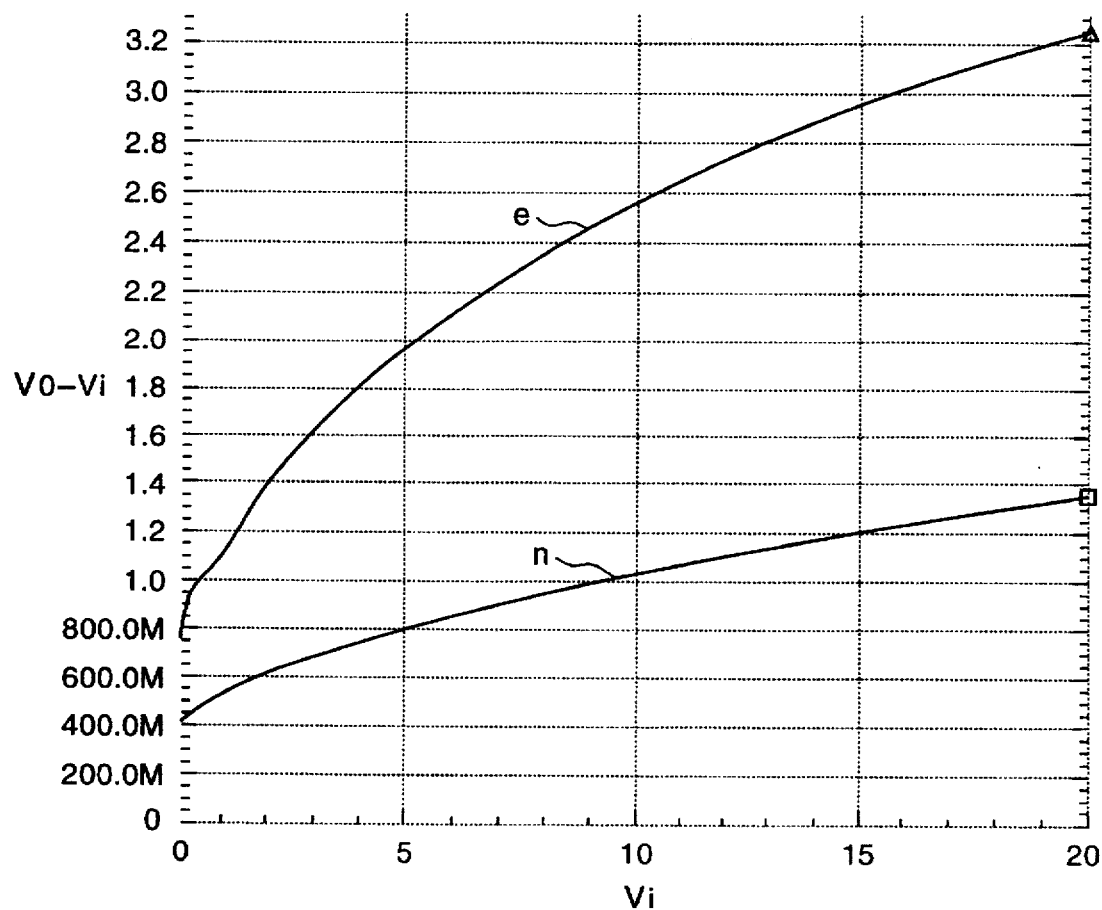

The detailed structure, features and characteristics of the present invention will be described more clearly with the descriptions of the preferred embodiments in conjunction with the accompanying drawings, in which:

FIG. 1A illustrates the first approach to implement a programming switch for non-volatile memory in accordance with the present invention;

FIG. 1B illustrates the second approach to implement a programming switch for non-volatile memory in accordance with the present invention;

FIG. 1C illustrates the third approach to implement a programming switch for non-volatile memory in accordance with the present invention;

FIG. 1D illustrates the first embodiment of a programming switch for non-volatile memory in accordance with the present invention;

FIG. 2 is the second embodiment of a programming switch for non-volatile memory in accordance with the present invention;

FIG. 3. is the third embodiment of a programming switch for non-volatile memory in accordance with the present invention;

FIG. 4. is the fourth embodiment of a programming switch for non-volatile memory in accordance with the present invention;

FIGS. 5A and 5B. show simulation results of output voltage and input current respectively with respect to the circuit shown in FIG. 2;

FIGS. 6A and 6B. show simulation results of output voltage and input current respectively with respect to the circuit shown in FIG. 3;

FIGS. 7A and 7B. show simulation results of output voltage and input current respectively with respect to the circuit shown in FIG. 4;

FIG. 8A shows the diode-connected NMOS used for simulation in FIGS. 5–7 concerning body effect; FIG. 8B shows the relation of input voltage versus output voltage of the NMOS connection of FIG. 8A.

DETAILED DESCRIPTION OF THE PREFERRED EMBODIMENT

Referring again to the circuit diagram of FIG. 1A, analysis will be carded out based on the following parameters: Vpp=20 volts; Vcc=2 volts; Vte (threshold voltage of enhancement-type NMOS)=0.7 volts.

Considering the first input condition: input voltage Vin is logic "1" & clock signals CK and CKB oscillate. Analysis is proceeded from the potential of node CP1, which is unknown (assume it is $\alpha$) at the beginning. When clock signal CK is logic "1" (CKB is logic "0"), capacitor C1 is coupled and thus potential of node CP1 is increased by as high as Vcc, becoming ($\alpha$+Vcc). The potential of node CP2 is that of CP1 subtracted by threshold voltage of NMOS M2, which is ($\alpha$+Vcc–Vte). Then when clock signal CKB is logic "1" (CK is logic "0"), capacitor C2 is coupled and similarly potential of node CP2 is increased by as high as Vcc, becoming ($\alpha$+2Vcc–Vte). Since node CP2 is connected to the gate of NMOS M1, which makes potential of CP1 be that of CP2 subtracted by threshold voltage of NMOS M1, becoming ($\alpha$+2Vcc–2Vte). Subsequently, when clock signal CK becomes logic "1" again, potential of node CP1 will be increased by Vcc, and so on. In short, potentials of both node CP1 and node CP2 will be increased rapidly, making output voltage Vout (which is approximately potential of node CP2 subtracted by threshold voltage of NMOS M3) go up rapidly to about Vpp.

Though the initial voltage α of node CP1 is unknown, since the value of Vout is increased by a value as high as (2Vcc−2Vte) in each clock period, experiments show that it will approach the programming voltage Vpp or even exceeds Vpp after tens of clock periods. However, when Vout exceeds breakdown voltage of drain or source, it will keep at a fixed value, i.e. the breakdown voltage, owing to breakdown of transistors.

Considering the second input condition: input voltage Vin is logic "1" (2 volts) but clock signals do not oscillate. The potentials of node CP1, node CP2 and output end will not be pulled up rapidly as in the first input condition. However, output voltage Vout will become Vcc−Vte, i.e. logic "1"−Vte, because of existence of NMOS M4.

Considering the third input condition: input voltage Vin is logic "0". Clock signals CK and CKB are inactive and NMOS M4 turns on, which results in output voltage Vout being logic "0".

As stated in the above, output voltage Vout versus input voltage Vin satisfies all the necessary relations as a programming switch.

In addition, a diode-connected enhancement-type NMOS M5 can also be incorporated as shown in FIG. 1B. The gate of M5 is connected to the output end and the drain and source are connected between the programming voltage Vpp and the output end. To explain the purpose of incorporating NMOS M5, consider the situation that Vcc is considerably high, then output voltage Vout will exceed Vpp, the existence of M5 makes output voltage Vout be fixed at Vpp+Vte. The advantage derived is that Vout has a definite upper limit which is not related with the value of Vcc.

In addition, a diode-connected enhancement-type or native-type NMOS M6 can also be incorporated as shown in FIG. 1C. The gate of M6 is connected to the input end and the drain and source are connected between the programming voltage Vpp and the node CP1. Because of existence of M6, node CP1 has a definite initial voltage, logic "1" subtracted by threshold voltage of M6, under the first input condition (Vin is logic "1" & clock signals oscillate). The advantage derived is that it takes less time for Vout to become the final fixed value.

Since the clock signals are active only when input voltage Vin is logic "1", a preferred embodiment satisfying the condition is as shown in FIG. 1D, in which a NAND gate, a NOT gate, and an external clock signal CLK is included. The NAND gate has two inputs: the clock signal CLK and the input voltage Vin, and one output which is used as one of the clock signals CK and CKB and as input of the NOT gate as well. The output of the NOT gate is used as the other of the clock signals CK and CKB.

The minimum operating voltage Vcc required in the present invention is analyzed as follows. According to the analysis under the first input condition, the value of Vout increases by a value (2Vcc−2Vte) in each clock period. The present invention works properly as long as the increment (2Vcc−2Vte) is not negative, which leads to Vcc≧Vte, wherein the value of Vte is on the order of 0.5~0.9 volts without back gate bias and 1.2~2.4 volts with back gate bias 20 volts. Therefore, the minimum operating voltage Vcc required is 2.4 volts for the worst case.

FIG. 2 illustrates the second embodiment in accordance with the present invention. The only differences between the circuit shown in FIG. 2 and the circuit shown in FIG. 1D lie in that enhancement-type NMOS M1 and M6 are replaced by native-type NMOS M1* and M6* (* is used for distinguishing native-type from enhancement-type) respectively. Generally, native-type NMOS's mean the NMOS which have threshold voltage Vtn about 0 volts (for example, −0.2~0.2 volts). Analysis of circuit operations is similar to that in FIG. 1A, which is thus omitted here. However, the minimum operating voltage Vcc is reduced to (Vte+Vtn)/2 because of the use of M1*, which is a significant improvement compared to FIG. 1D. The value of Vtn is on the order of −0.2~0.2 volts without back gate bias and 0.6~1.6 volts with back gate bias 20 volts, the minimum operating voltage Vcc required is thus 2.0 volts for the worst case. Furthermore, native-type NMOS M6* can also be replaced by an enhancement-type NMOS or even omitted without affecting circuit operations.

FIG. 3 illustrates the third embodiment in accordance with the present invention. The only differences between the circuit shown in FIG. 3 and the circuit shown in FIG. 1D lie in that enhancement-type NMOS M2 and M6 are replaced by native-type NMOS M2* and M6* respectively. Similar to FIG. 2, the circuit shown in FIG. 3 has minimum operating voltage Vcc=(Vte+Vtn)/2, which is 2.0 volts for the worst case. Again, native-type NMOS M6* can be replaced by an enhancement-type NMOS or even omitted without affecting circuit operations. Furthermore, output voltage Vout in this case is higher than the case of FIG. 2 by a value Vt because M2* is used instead of M2.

FIG. 4 illustrates the fourth embodiment in accordance with the present invention. The differences between the circuit shown in FIG. 4 and the circuit shown in FIG. 1D lie in that enhancement-type NMOS M2 and M3 are replaced by native-type NMOS M2*, and M3*, respectively. The minimum operating voltage Vcc is also (Vte+Vtn)/2, which is again 2.0 volts for the worst case. In addition, enhancement-type NMOS M6 can be omitted without affecting circuit operations, but it cannot be replaced by a native-type NMOS. Besides, output voltage Vout in this case is even higher than the case of FIG. 3 by a value Vt because M2* and M3* are used instead of M2* and M3.

From the above analyses, it is obvious that the circuits of FIGS. 2, 3 and 4 all give better results than that given by the circuit of FIG. 1D. Simulation of output voltage Vout and input current I are thus executed with regard to the circuits of FIGS. 2, 3 and 4 in order to support the above theoretical analysis. FIGS. 5A and 5B are simulation results of Vout and I respectively with regard to the circuit of FIG. 2, wherein T1, T2, T3 and T4 represent four different situations as follows.

T1: Vin is logic "1" & CLK oscillate;
T2: Vin is logic "0" & CLK oscillate;
T3: Vin is logic "1" & CLK does not oscillate;
T4: Vin is logic "0" & CLK does not oscillate.

It is shown in FIG. 5A that Vout becomes final value 16 volts, which is approximately Vpp=20 volts, in a very short time under T1 situation. Also shown in FIG. 5A that Vout is zero under T2 and T4 situations and logic "1"−Vte under T3 situation. All the above results coincide with theoretical analysis.

FIG. 5B shows input current I drawn from Vpp whose ideal values need to be zero under T1, T2, T3 and T4 situations. It is shown that the input current has average value almost zero after a very short time under T1 situation and are zero under T2, T3 and T4 situations. Again, all the above results coincide with theoretical analysis.

FIGS. 6A and 6B are simulation results of Vout and I respectively with regard to the circuit of FIG. 3. FIGS. 7A and 7B are simulation results of Vout and I respectively with regard to the circuit of FIG. 4. From these simulation results it is deduced that the circuits shown in FIGS. 2, 3 and 4 satisfy all requirements for a programming switch. In addition, the Vout derived by the circuit of FIG. 4 is higher than that derived by the circuit of FIG. 3, which is higher than that derived by the circuit of FIG. 2.

FIGS. 8A and 8B are used to explain influence coming from body effect of transistors according to the present invention is very little. Body effect of a typical NMOS transistor used in the programming switch of the present invention is measured as follows: the NMOS transistor is diode-connected as shown in FIG. 8A, wherein Vo and Vi are included. FIG. 8B shows the experiment results of (Vo−Vi) versus Vi, wherein the lines marked e and n are experiment results with respect to enhancement-type and native-type NMOS respectively. The enhancement-type and native-type NMOS have (Vo−Vi) as high as 3 volts and 1 volt respectively while Vi=20 volts, which means that body effects of the two NMOS are quite significant. However, the programming switch in accordance with the present invention still gives excellent results using operating voltage Vcc=2 volts under such significant body effect.

The above description of the preferred embodiments of the present invention is intended to be utilized as an illustration of the concept of the present invention. The scope of the present invention is by no means limited by these embodiments. It is clear that various variations can be made to the system within the spirit and scope of the present invention. The scope of the present invention shall be defined in the following claims.

What is claimed is:

1. A programming switch for non-volatile memory comprising:

a programming voltage Vpp generated inside the non-volatile memory with typical value 15 to 20 volts;

a supply voltage Vcc provided by external power supply;

an input end whose voltage Vin has two different values: logic "1" and logic "0";

an output end with voltage Vout;

two clock signals CK and CKB which are inverse to each other and activated only when Vin is logic "1";

a first node and a second node;

a first enhancement-type NMOS whose gate is connected to said second node and whose drain and source are connected between said programming voltage Vpp and said first node;

a second diode-connected enhancement-type NMOS whose gate is connected to said first node and whose drain and source are connected between said first node and said second node;

a third diode-connected enhancement-type NMOS whose gate is connected to said second node and whose drain and source are connected between said second node and said output end;

a fourth enhancement-type NMOS whose gate is connected to said supply voltage Vcc and whose drain and source are connected between said input end and said output end;

a first capacitor in which one end thereof is connected to said clock CK and another end thereof is connected to said first node; and a second capacitor in which one end thereof is connected to said clock CKB and another end thereof is connected to said second node, so that the following relations of said Vout versus said Vin hold: while Vin is logic "0", Vout is logic "0", while Vin is logic "1", Vout is approximately Vpp or logic "1".

2. A programming switch for non-volatile memory as claimed in claim 1 further comprising a fifth diode-connected enhancement-type NMOS whose gate is connected to said output end and whose drain and source are connected between said programming voltage Vpp and said output end.

3. A programming switch for non-volatile memory as claimed in claim 1 further comprising a sixth enhancement-type or native-type NMOS whose gate is connected to said input end and whose drain and source are connected between said programming voltage Vpp and said first node.

4. A programming switch for non-volatile memory as claimed in claim 1, wherein said clock signals CK and CKB are derived by utilizing an external clock signal CLK, a NAND gate accepting said Vin and said external clock signal CLK as its two inputs and its output being used as one of said CK and CKB, and a NOT gate accepting said output of said NAND gate and its output being used as the other of said CK and CKB.

5. A programming switch for non-volatile memory comprising:

a programming voltage Vpp generated inside the non-volatile memory with typical value 15 to 20 volts;

a supply voltage Vcc provided by external power supply;

an input end whose voltage Vin has two different values: logic "1" and logic "0";

an output end with voltage Vout;

two clock signals CK and CKB which are inverse to each other and activated only when Vin is logic "1";

a first node and a second node;

a first native-type NMOS whose gate is connected to said second node and whose drain and source are connected between said programming voltage Vpp and said first node;

a second diode-connected enhancement-type NMOS whose gate is connected to said first node and whose drain and source are connected between said first node and said second node;

a third diode-connected enhancement-type NMOS whose gate is connected to said second node and whose drain and source are connected between said second node and said output end;

a fourth enhancement-type NMOS whose gate is connected to said supply voltage Vcc and whose drain and source are connected between said input end and said output end;

a first capacitor in which one end thereof is connected to said clock CK and another end thereof is connected to said first node; and a second capacitor in which one end thereof is connected to said clock CKB and another end thereof is connected to said second node, so that the following relations of said Vout versus said Vin hold: while Vin is logic "0", Vout is logic "0", while Vin is logic "1", Vout is approximately Vpp or logic "1".

6. A programming switch for non-volatile memory as claimed in claim 5 further comprising a fifth diode-connected enhancement-type NMOS whose gate is connected to said output end and whose drain and source are connected between said programming voltage Vpp and said output end.

7. A programming switch for non-volatile memory as claimed in claim 5 further comprising a sixth enhancement-type or native-type NMOS whose gate is connected to said input end and whose drain and source are connected between said programming voltage Vpp and said first node.

8. A programming switch for non-volatile memory as claimed in claim 5, wherein said clock signals CK and CKB are derived by utilizing an external clock signal CLK, a NAND gate accepting said Vin and said external clock signal CLK as its two inputs and its output being used as one of said CK and CKB, and a NOT gate accepting said output of said NAND gate and its output being used as the other of said CK and CKB.

9. A programming switch for non-volatile memory comprising:

a programming voltage Vpp generated inside the non-volatile memory with typical value 15 to 20 volts;

a supply voltage Vcc provided by external power supply;

an input end whose voltage Vin has two different values: logic "1" and logic "0";

an output end with voltage Vout;

two clock signals CK and CKB which are inverse to each other and activated only when Vin is logic "1";

a first node and a second node;

a first enhancement-type NMOS whose gate is connected to said second node and whose drain and source are connected between said programming voltage Vpp and said first node;

a second diode-connected native-type NMOS whose gate is connected to said first node and whose drain and source are connected between said first node and said second node;

a third diode-connected enhancement-type NMOS whose gate is connected to said second node and whose drain and source are connected between said second node and said output end;

a fourth enhancement-type NMOS whose gate is connected to said supply voltage Vcc and whose drain and source are connected between said input end and said output end;

a first capacitor in which one end thereof is connected to said clock CK and another end thereof is connected to said first node; and a second capacitor in which one end thereof is connected to said clock CKB and another end thereof is connected to said second node, so that the following relations of said Vout versus said Vin hold: while Vin is logic "0", Vout is logic "0", while Vin is logic "1", Vout is approximately Vpp or logic "1".

10. A programming switch for non-volatile memory as claimed in claim 9 further comprising a fifth diode-conected enhancement-type NMOS whose gate is connected to said output end and whose drain and source are connected between said programming voltage Vpp and said output end.

11. A programming switch for non-volatile memory as claimed in claim 9 further comprising a sixth enhancement-type or native-type NMOS whose gate is connected to said input end and whose drain and source are connected between said programming voltage Vpp and said first node.

12. A programming switch for non-volatile memory as claimed in claim 11, wherein said clock signals CK and CKB are derived by utilizing an external clock signal CLK, a NAND gate accepting said Vin and said external clock signal CLK as its two inputs and its output being used as one of said CK and CKB, and a NOT gate accepting said output of said NAND gate and its output being used as the other of said CK and CKB.

13. A programming switch for non-volatile memory comprising:

a programming voltage Vpp generated inside the non-volatile memory with typical value 15 to 20 volts;

a supply voltage Vcc provided by external power supply;

an input end whose voltage Vin has two different values: logic "1" and logic "0";

an output end with voltage Vout;

two clock signals CK and CKB which are inverse to each other and activated only when Vin is logic "1";

a first node and a second node;

a first enhancement-type NMOS whose gate is connected to said second node and whose drain and source are connected between said programming voltage Vpp and said first node;

a second diode-connected native-type NMOS whose gate is connected to said first node and whose drain and source are connected between said first node and said second node;

a third diode-connected native-type NMOS whose gate is connected to said second node and whose drain and source are connected between said second node and said output end;

a fourth enhancement-type NMOS whose gate is connected to said supply voltage Vcc and whose drain and source are connected between said input end and said output end;

a first capacitor in which one end thereof is connected to said clock CK and another end thereof is connected to said first node; and a second capacitor in which one end thereof is connected to said clock CKB and another end thereof is connected to said second node, so that the following relations of said Vout versus said Vin hold: while Vin is logic "0", Vout is logic "0", while Vin is logic "1", Vout is approximately Vpp or logic "1".

14. A programming switch for non-volatile memory as claimed in claim 13 further comprising a fifth diode-connected enhancement-type NMOS whose gate is connected to said output end and whose drain and source are connected between said programming voltage Vpp and said output end.

15. A programming switch for non-volatile memory as claimed in claim 13 further comprising a sixth enhancement-type NMOS whose gate is connected to said input end and whose drain and source are connected between said programming voltage Vpp and said first node.

16. A programming switch for non-volatile memory as claimed in claim 13, wherein said clock signals CK and CKB are derived by utilizing an external clock signal CLK, a NAND gate accepting said Vin and said external clock signal CLK as its two inputs and its output being used as one of said CK and CKB, and a NOT gate accepting said output of said NAND gate and its output being used as the other of said CK and CKB.

* * * * *